(12) United States Patent
Moon et al.

(10) Patent No.: US 10,217,635 B2
(45) Date of Patent: Feb. 26, 2019

(54) METHOD OF MANUFACTURING SEMICONDUCTOR DEVICE

(71) Applicant: Samsung Electronics Co., Ltd., Suwon-si, Gyeonggi-do (KR)

(72) Inventors: Yong Seung Moon, Yongin-si (KR); Byung Gook Kim, Seoul (KR); Jae Hyuck Choi, Seoul (KR); Sung Won Kwon, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/411,298

(22) Filed: Jan. 20, 2017

(65) Prior Publication Data
US 2017/0278710 A1  Sep. 28, 2017

(30) Foreign Application Priority Data

Mar. 25, 2016  (KR) .......................... 10-2016-0036039

(51) Int. Cl.
*H01L 21/033* (2006.01)
*H01L 21/311* (2006.01)
(Continued)

(52) U.S. Cl.
CPC ............ *H01L 21/0338* (2013.01); *G03F 1/80* (2013.01); *H01L 21/0274* (2013.01);
(Continued)

(58) Field of Classification Search
CPC ............. H01L 21/0338; H01L 21/0337; H01L 21/0332; H01L 21/0335; H01L 21/02675;
(Continued)

(56) References Cited

U.S. PATENT DOCUMENTS 4,536,252 A * 8/1985 McDonald .......... H01L 21/3065
204/157.41
5,319,183 A * 6/1994 Hosoya .................. B23K 1/018
134/1
(Continued)

FOREIGN PATENT DOCUMENTS

JP  0572714  9/1993
JP  5104832  10/2002
(Continued)

OTHER PUBLICATIONS

JP 2011-059285, Mar. 24, 2011, JPO English machine translation. (Year: 2011).*
(Continued)

*Primary Examiner* — Anita K Alanko
(74) *Attorney, Agent, or Firm* — Myers Bigel, P.A.

(57) ABSTRACT

Provided is a method of manufacturing a semiconductor device. The method of manufacturing a semiconductor device includes forming a target etching layer on a substrate, patterning the target etching layer to form a pattern layer including a pattern portion having a first height and a first width and a recess portion having a second width, providing a first gas and a second gas on the pattern layer, and performing a reaction process including reacting the first and second gases with a surface of the pattern portion by irradiating a laser beam on the pattern layer. The performing the reaction process includes removing a portion of sidewalls of the pattern portion so that the pattern portion has a third width that is smaller than the first width.

20 Claims, 19 Drawing Sheets

(51) Int. Cl.
*H01L 21/027* (2006.01)
*G03F 1/80* (2012.01)
*B23K 26/12* (2014.01)
*B23K 26/362* (2014.01)
*B29C 59/14* (2006.01)
*H01L 21/304* (2006.01)
*H01L 21/02* (2006.01)
*H01L 21/306* (2006.01)
*B29C 59/16* (2006.01)
*G03F 7/004* (2006.01)

(52) U.S. Cl.
CPC ...... *H01L 21/0332* (2013.01); *H01L 21/0335* (2013.01); *H01L 21/0337* (2013.01); *H01L 21/31138* (2013.01); *B23K 26/126* (2013.01); *B23K 26/362* (2013.01); *B29C 59/14* (2013.01); *B29C 59/16* (2013.01); *B29C 2791/009* (2013.01); *G03F 7/0041* (2013.01); *H01L 21/02675* (2013.01); *H01L 21/304* (2013.01); *H01L 21/30621* (2013.01)

(58) Field of Classification Search
CPC ............ H01L 21/304; H01L 21/30621; G03F 7/0041; B29C 59/16; B29C 59/14; B29C 59/126; B29C 2791/009; B23K 26/362
See application file for complete search history.

(56) References Cited

U.S. PATENT DOCUMENTS

| | | | | |
|---|---|---|---|---|
| 5,874,011 A | * | 2/1999 | Ehrlich | C23F 4/02 216/65 |
| 5,965,301 A | * | 10/1999 | Nara | G03F 1/74 430/5 |
| 6,030,730 A | * | 2/2000 | Smolinski | G03F 1/74 430/5 |
| 6,368,982 B1 | * | 4/2002 | Yu | H01L 21/28123 216/51 |
| 7,521,156 B2 | | 4/2009 | Ahn et al. | |
| 7,851,369 B2 | * | 12/2010 | Kamp | H01L 21/32139 438/717 |
| 7,927,770 B2 | | 4/2011 | Kanamitsu | |
| 8,822,103 B2 | | 9/2014 | Kominato et al. | |
| 8,974,987 B2 | | 3/2015 | Nagai et al. | |
| 2003/0000930 A1 | * | 1/2003 | Hamada | G02B 27/0988 219/121.73 |
| 2013/0130160 A1 | * | 5/2013 | Yoshikawa | G03F 1/00 430/5 |
| 2013/0309873 A1 | * | 11/2013 | Ruzic | H01L 21/3065 438/735 |
| 2015/0064918 A1 | * | 3/2015 | Ranjan | H01L 21/3065 438/710 |
| 2015/0118603 A1 | | 4/2015 | Hong et al. | |
| 2015/0160550 A1 | | 6/2015 | Kim et al. | |
| 2017/0028510 A1 | * | 2/2017 | Shin | B23K 26/362 |

FOREIGN PATENT DOCUMENTS

| | | |
|---|---|---|
| JP | 4325175 | 6/2006 |
| JP | 2013-089691 | 5/2013 |
| JP | 2013-210497 | 10/2013 |
| JP | 2015-161834 | 9/2015 |
| KR | 0156421 | 7/1998 |
| KR | 0474012 | 3/2005 |

OTHER PUBLICATIONS

Matsuo, P.J., et al., "Silicon etching in $NF_3/O_2$ remote microwave plasmas," J. Vac. Sci. Technol. A 17(5), Sep./Oct. 1999, pp. 2431-2437.

* cited by examiner

METHOD OF MANUFACTURING SEMICONDUCTOR DEVICE

The present application claims priority under 35 U.S.C. 119 from Korean Patent Application No. 10-2016-0036039, filed on Mar. 25, 2016, the disclosure of which is incorporated by reference herein in its entirety.

BACKGROUND

The inventive concept disclosed herein relates to a method of manufacturing a semiconductor device. More particularly, the inventive concept relates to a method of manufacturing semiconductor devices including a method of forming patterns used in a semiconductor manufacturing process.

As semiconductor devices become more highly integrated, the width of patterns formed on a semiconductor substrate and the spacing between adjacent patterns become smaller. Accordingly, exposure techniques for forming fine patterns on a semiconductor substrate are constantly being evaluated and refined. A conventional one of these exposure techniques is a reduction projection exposure method using ultraviolet light. However, this method is limited in its ability to form fine patterns having a minute design rule. Recently, an exposure technique using a laser beam has been tried for forming ultra-fine patterns on a semiconductor substrate.

SUMMARY

Aspects of the inventive concept provide a method of manufacturing a semiconductor device having a fine pattern.

Aspects of the inventive concept also provide a method of manufacturing a semiconductor device capable of controlling a height and/or width of patterns.

Aspects of the inventive concept also provide a method of forming a photo mask pattern capable of controlling transmittance.

Aspects of the inventive concept provide a method of manufacturing a semiconductor device, the method including forming a target etching layer on a substrate, patterning the target etching layer to form a pattern layer including a pattern portion having a first height and a first width and a recess portion having a second width, providing a first gas and a second gas on the pattern layer, and performing a reaction process including reacting the first and second gases with a surface of the pattern portion by irradiating a laser beam on the pattern layer. The performing the reaction process includes removing a portion of sidewalls of the pattern portion so that the pattern portion has a third width that is smaller than the first width.

Aspects of the inventive concept provide a method of manufacturing a semiconductor device, the method including forming a target etching layer on a substrate, patterning the target etching layer to form a pattern layer including a plurality of pattern portions each having a first height and a first width and a plurality of recess portions each having a second width, providing a third gas in each recess portion, providing a first gas and a second gas on the pattern layer, and performing a reaction process including reacting the first to third gases with a surface of each pattern portion by irradiating a laser beam on the pattern layer. The performing the reaction process includes removing a portion of sidewalls of each pattern portion so that each pattern portion has a third width that is smaller than the first width.

Aspects of the inventive concept provide a method of manufacturing a semiconductor device, the method including forming a first layer on a substrate, patterning the first layer to form a pattern layer including a plurality of pattern portions each having a first height and a first width and a plurality of recess portions each having a second width, providing a first gas and a second gas on the pattern layer, and generating a chemical reaction between the first and second gases and a surface of each pattern portion by irradiating a laser beam on the pattern layer to remove a portion of sidewalls of each pattern portion so that each pattern portion has a third width that is smaller than the first width.

Aspects of the inventive concept provide a method of manufacturing a semiconductor device, the method including forming a target etching layer on a substrate, patterning the target etching layer to form a pattern layer including a pattern portion having a first height and a first width, providing a first gas and a second gas on the pattern portion, and performing a reaction process including reacting the first and second gases with a surface of the pattern portion by irradiating a laser beam having a large width greater than the first width on the pattern portion. The performing the reaction process includes removing a portion of the pattern portion so that the pattern portion has a third width that is smaller than the first width, and a second height that is smaller than the first height.

Aspects of the inventive concept provide a method of manufacturing a semiconductor device, the method including forming a photo mask layer on a light transmission layer, patterning the photo mask layer to form a photo mask pattern layer which includes a pattern portion having a first height and a first width and a recess portion having a second width, providing a first gas and a second gas on the photo mask pattern layer, and performing a reaction process including reacting the first and second gases with a surface of the pattern portion by irradiating a laser beam on the photo mask pattern layer. The performing the reaction process comprises removing a portion of sidewalls of the pattern portion so that the pattern portion has a third width that is smaller than the first width.

Aspects of the inventive concept provide a method of manufacturing a semiconductor device, the method including forming a photo mask layer on a light transmission layer, patterning the photo mask layer to form a photo mask pattern layer which includes a pattern portion having a first height and a first width and a recess portion having a second width, providing a third gas in the recess portion, providing a first gas and a second gas on the photo mask pattern layer, and performing a reaction process including reacting the first to third gases with a surface of the pattern portion by irradiating a laser beam on the photo mask pattern layer. The performing the reaction process comprises removing a portion of sidewalls of the pattern portion so that the pattern portion has a third width that is smaller than the first width.

Aspects of the inventive concept provide a method of manufacturing a semiconductor device, the method including forming a photo mask layer on a light transmission layer, patterning the photo mask layer to form a photo mask pattern layer which including a plurality of pattern portions each having a first height and a first width, providing a first gas and a second gas on each pattern portion, and performing a reaction process including reacting the first and second gases with a surface of each pattern portion by irradiating a laser beam having a width greater than the first width on each pattern portion. The performing the reaction process includes removing a portion of each pattern portion so that each pattern portion has a third width that is smaller than the first width and a second height that is smaller than the first height.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

DETAILED DESCRIPTION OF THE EMBODIMENTS

Figure 1:
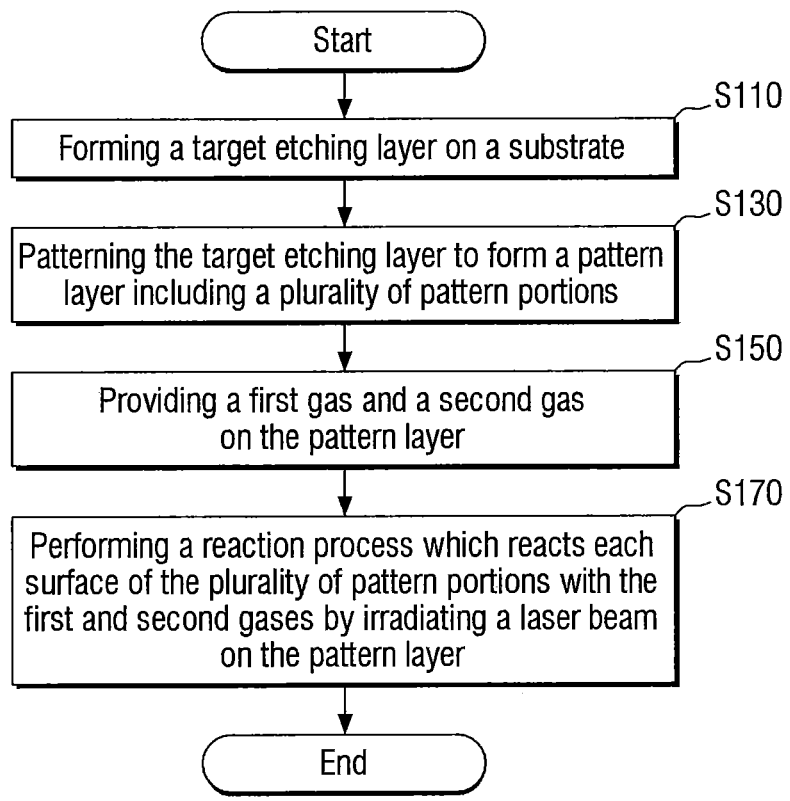
FIG. 1 is a flow chart for illustrating a method of manufacturing a semiconductor device according to some example embodiments of the inventive concept.

Advantages and features of the inventive concept and methods of accomplishing the same may be understood more readily by reference to the following detailed description of example embodiments and the accompanying drawings. The inventive concept may, however, be embodied in many different forms and should not be construed as being limited to the embodiments set forth herein. Rather, these embodiments are provided so that this disclosure will be thorough and complete and will fully convey the concept of the disclosure to those skilled in the art, and the inventive concept will only be defined by the appended claims. In the drawings, the thickness of layers and regions may be exaggerated for clarity. Like numbers refer to like elements throughout. As used herein, the term "and/or" includes any and all combinations of one or more of the associated listed items.

Hereinafter, a method of manufacturing a semiconductor device according to some example embodiments of the inventive concept will be described with reference to FIGS. 1 to 11.

FIG. 1 is a flow chart for illustrating a method of manufacturing a semiconductor device according to some example embodiments of the inventive concept. FIGS. 2 to 11 are cross-sectional views for illustrating a method of manufacturing a semiconductor device according to some embodiments of the inventive concept.

Referring to FIG. 1, a method of manufacturing a semiconductor device according to an example embodiment of the inventive concept may include forming a target etching layer on a substrate (step S110), patterning the target etching layer to form a pattern layer including a plurality of pattern portions (step S130), providing a first gas and a second gas on the pattern layer (step S150), and performing a reaction process which reacts each surface of the plurality of pattern portions with the first and second gases by irradiating a laser beam on the pattern layer (step S170).

Figure 2:
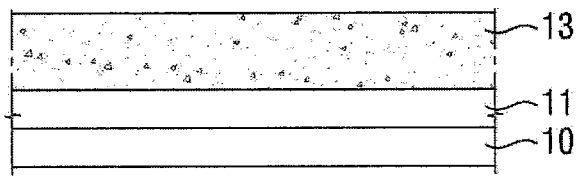
FIGS. 2 to 11 are cross-sectional views for illustrating a method of manufacturing a semiconductor device according to some embodiments of the inventive concept.

Referring to FIGS. 1 and 2, a target etching layer 11 may be formed on a substrate 10 (step S110). The substrate 10 may be variously changed according to the type and purpose of the target etching layer 11 to be patterned. For example, if the purpose for patterning the target etching layer 11 is to form a photo mask pattern, the substrate 10 may be an optical transmission or transmissive layer that can transmit light. For example, the substrate 10 may be a glass substrate that may be transparent. In addition, if the target etching layer 11 is a hard mask layer, the substrate 10 may be a semiconductor layer.

Accordingly, the substrate 10 may be formed of a material which does not react with first and second gases as described below, or has an etch selectivity with respect to the target etching layer 11 during patterning the target etching layer 11.

The target etching layer 11 may be also variously changed according to the purpose of patterning the target etching layer 11. For example, if the purpose for patterning the target etching layer 11 is to form a photo mask pattern, the target etching layer 11 may include chromium (Cr) or molybdenum silicide. In addition, if the purpose for patterning the target etching layer 11 is to pattern the substrate 10 made of a semiconductor layer, the target etching layer 11 may be made of, but is not limited to, a material including at least one of a silicon oxide layer, a silicon nitride layer and a silicon oxynitride layer.

In this example embodiment, as an example of the purpose of patterning the target etching layer 11, formation of the photo mask pattern will be described. It is to be noted that the purpose for patterning the target etching layer 11 according to the inventive concept is not limited thereto.

The target etching layer 11 may be formed on the substrate 10 to have a thickness ranging from 0.1 to 0.5 μm. The target etching layer 11 may be patterned by a lithography method or a direct imaging method using a laser. In this example embodiment, as an example of the method of patterning the target etching layer 11, the lithography method using the photoresist layer will be described. It is to be noted that the lithography method is merely an example and the method of patterning the target etching layer 11 according to the inventive concept is not limited thereto.

A photoresist layer 13 may be formed on the target etching layer 11. The photoresist layer may be formed using chemical vapor deposition (CVD), spin coating, plasma enhanced CVD (PECVD), high density plasma CVD (HDP-CVD) and the like.

The photoresist layer 13 may be formed on the target etching layer 11 to have a thickness ranging from 30 to 60 nm. For example, the photoresist layer 13 may be formed on the target etching layer 11 to have a thickness of 50 nm. The thickness of the photoresist layer 13 may be determined taking into account a size of a target pattern.

When a spin coating process is used for forming the photoresist layer 13, photoresist is sprayed onto the substrate 10 while the substrate 10 is rotating at a low speed, and then the substrate 10 is accelerated up to a predetermined rotation speed so that it rotates at a high speed, thereby adjusting the thickness of the photoresist layer 13 to a desired thickness. Once the photoresist layer 13 reaches the desired thickness, the substrate 10 is decelerated to a low speed to remove residuals.

A chemical treatment may be performed on a surface of the target etching layer 11 or the substrate 10 before forming the photoresist layer 13, in order to enhance adhesion with the photoresist layer 13. The chemical treatment may be, for example, a hexamethyldisilazane (HMDS) treatment. If the surface of the target etching layer 11 or substrate 10 is hydrophilic, the surface may be changed to be hydrophobic through the chemical treatment, so as to enhance the adhesion with the photoresist layer 13.

Referring to FIGS. 1 and 3 to 8, a pattern layer 15 including a plurality of pattern portions 15a may be formed by patterning the target etching layer 11 (step S130).

Figure 3:
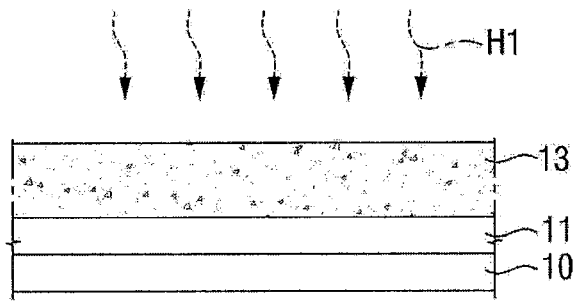

Referring to FIG. 3, a first baking process H1 may be performed on the substrate 10. In the first baking process H1, the photoresist layer 13 formed on the target etching layer 11 is heated so that an organic solvent contained in the photoresist layer 13 may be removed.

For example, the first baking process H1 may be performed at a temperature between 50 and 200° C. for about 30 to 180 seconds so that an organic solvent contained in the photoresist layer 13 may be removed. A density of the photoresist layer 13 may be increased through the first baking process H1, thereby reducing sensitivity to environmental change. In addition, contamination of an exposure-equipment and a mask due to residual organic solvents may be prevented, and light-sensitivity characteristics of the photoresist layer 13 may be constantly maintained.

Figure 4:
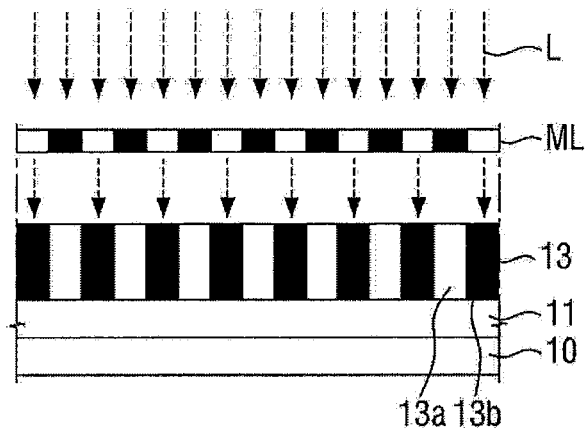

Referring to FIG. 4, the photoresist layer 13 may be exposed to light to thereby form patterns. Specifically, a photo mask ML may be disposed on the photoresist layer 13 to form patterns, and then light L may be irradiated on the photo mask ML to form a first pattern 13a and a second pattern 13b.

The first pattern 13a may be formed in an area where the light L is not irradiated, whereas the second pattern 13b may be formed in an area where the light L is irradiated. If the photoresist layer 13 is a positive photoresist, a chemical reaction takes place in the area where the light L is irradiated so that the area may be removed by a developing solution. If the photoresist layer 13 is a negative photoresist, the area where the light L is not irradiated may be removed by a developing solution.

Although the photoresist layer 13 is a positive photoresist in this example embodiment, it is to be understood that the photoresist layer 13 is not limited to being the positive photoresist.

In this example embodiment, the exposure process at this step may be an extreme ultraviolet (EUV) exposure process for forming a fine pattern, and may irradiate the light L using i-line, a krypton fluoride (KrF) laser, or an argon fluoride (ArF) laser.

Although the exposure process is performed using the photo mask ML in this example embodiment, this is merely illustrative and the inventive concept is not limited thereto. For example, in an example embodiment, the exposure process may be performed without using the photo mask, i.e., a maskless exposure process.

Figure 5:
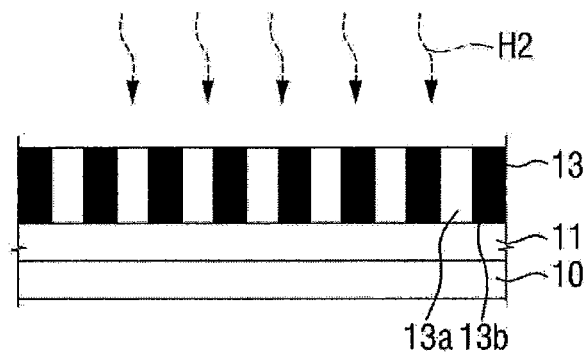

Referring to FIG. 5, a second baking process H2 may be performed to dry the photoresist layer 13. The second baking process H2 may be performed at temperature ranging between 50 to 250° C. for 50 to 250 seconds. However, the second baking process is not limited thereto.

Through the second baking process H2, a chemical amplification reaction may take place in the photoresist layer 13. If the photoresist layer 13 is an ArF photoresist using a wavelength of 193 nm, the photoresist layer 13 may be a chemical amplified resist. In this case, the second baking process H2 may affect a sensitivity of the photoresist layer 13. However, the inventive concept is not limited thereto.

Figure 6:
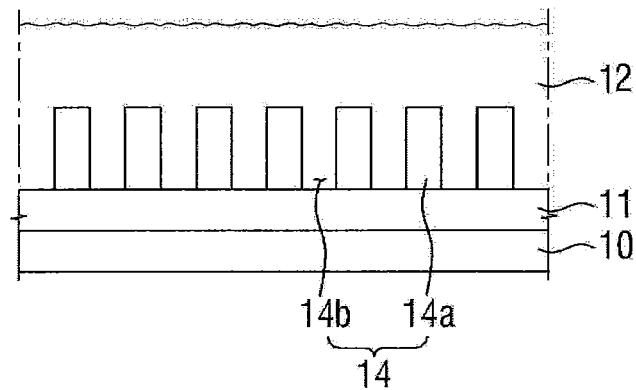

Referring to FIG. 6, a developing solution 12 may be applied onto the photoresist layer, thereby forming a photoresist pattern 14.

The photoresist pattern 14 may include a photoresist pattern or raised portion 14a and a photoresist recess portion 14b. If the photoresist layer 13 is a positive photoresist, the developing solution may include, but is not limited to, a water-soluble alkali solution such as tetramethyl-ammonium-hydroxide (TMAH) water solution. A developing time with the developing solution may be determined taking into account a thickness of the photoresist layer 13.

Figure 7:
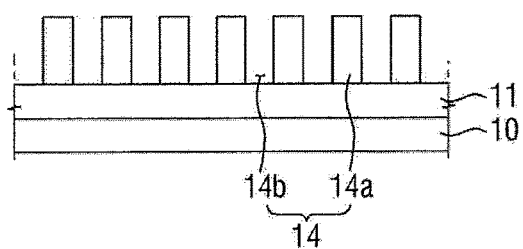

Referring to FIG. 7, the developing solution 12 may be removed, thereby exposing the photoresist pattern 14. The developing solution 12 may be removed by, but is not limited to, a spin-dry process.

Figure 8:
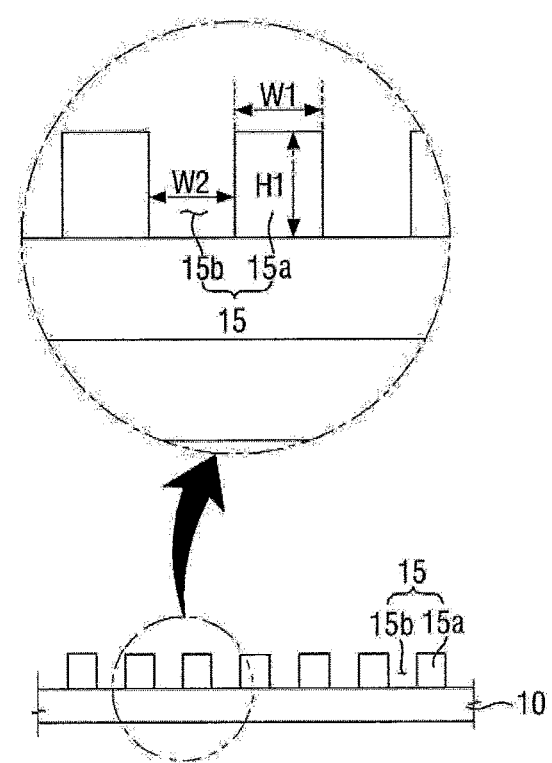

Referring to FIG. 8, the target etching layer 11 may be patterned using the photoresist pattern 14. Specifically, a pattern layer 15 including a pattern or raised portion 15a and a recess portion 15b may be formed by patterning the target etching layer 11.

The pattern layer 15 may include a plurality of pattern or raised portions 15a and a plurality of recess portions 15b disposed between the plurality of pattern portions 15a. Although seven pattern portions 15a and six recess portions 15b are shown in this example embodiment, this is merely illustrative and the inventive concept is not limited thereto.

The pattern portion 15a may have a first height H1 and a first width W1. The recess portion 15b may have a second width W2. A depth of the recess portion 15b may be defined based on the first height H1 of the pattern portion 15a.

Figure 9:
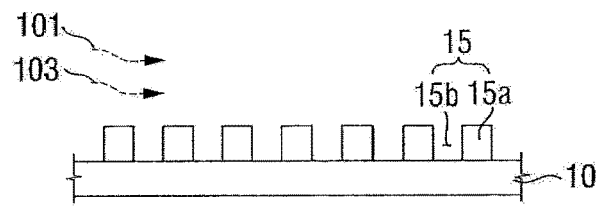

Subsequently, referring to FIGS. 1 and 9, a first gas 101 and a second gas 103 may be provided on the pattern layer 15 (step S150).

The first gas 101 may be a halogen compound gas. For example, the first gas 101 may include, but is not limited to, at least one of $CF_4$, $SF_4$ and $NF_4$.

Accordingly, the first gas 101 may include a material represented by formula consisting of $A_xB_y$. Here, A is an element capable of combining with oxygen, and B is an element capable of combining with elements constituting the pattern portion 15a. That is, B is an element that is used to etch the pattern portion 15a. In the above formula, y is greater than x. For example, y is 4 and x is 1. In this example embodiment, the first gas 101 may be a main gas which plays a major role in etching of the pattern portion 15a.

The second gas 103 may be an oxygen gas. If the second gas 103 is an oxygen gas, roughness of the pattern portion 15a may be improved (e.g., reduced) by using a gas mixed with the first and second gases 101 and 103. This is because an etching and passivation occurs at the same time on a surface of the pattern portion 15a. Further detailed description thereof will be described below. In this example embodiment, the second gas 103 may be an auxiliary gas which plays a minor role in etching of the pattern portion 15a.

Providing the first and second gases 101 and 103 on the pattern layer 15 may be achieved in a chamber device. In this case, the chamber device may be maintained in a high vacuum state of about $10^{-6}$ Torr or less.

In addition, the first and second gases 101 and 103 may be simultaneously or sequentially provided, and the inventive concept is therefore not limited to the simultaneous providing as shown in the drawings.

Figure 10:
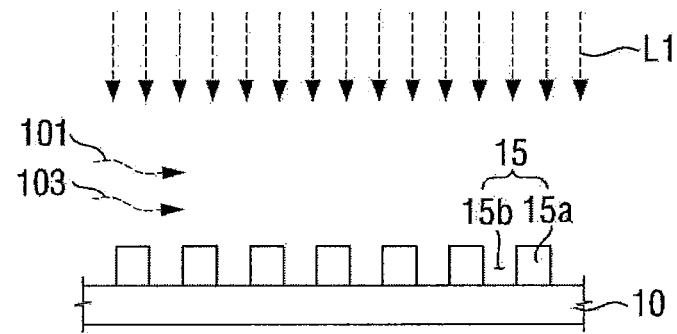

Referring to FIGS. 1 and 10, a laser beam L1 may be irradiated on the pattern layers 15. When the laser beam L1 is irradiated on a surface of the pattern portion 15a, a reaction process which reacts the first and second gases 101 and 103 with the surface of the pattern portion 15a may be performed. In other words, a reaction between the first and second gases 101 and 103 and the surface of the pattern portion 15a may occur due to the irradiation of the laser beam L1 on the surface of the pattern portion 15a.

Specifically, when the laser beam L1 is irradiated on the first and second gases 101 and 103 and the surface of the pattern portion 15a, an excitation may take place. In other words, a chemical reaction between molecular radicals generated by dissociation of the first and second gases 101 and 103 and atoms constituting of a surface of the pattern portion 15a may occur due to an excitation through the laser beam L1.

The chemical reaction will be described in more detail below.

In the description of the present example embodiments, the pattern portion 15a, the first gas 101 and the second gas 103 are assumed to use molybdenum silicide (MoSi), NF3 and O2, respectively. In addition, the laser beam L1 is assumed to use a pulse laser having a wavelength of 355 nm.

When irradiating the laser beam L1, silicon (Si) of elements constituting the pattern portion 15a may be combined with fluorine (F) of elements constituting the first gas 101, thereby forming a volatile material $SiF_4$. Vacancies formed due to silicon (Si) atoms escaping from the pattern portion 15a may be filled with oxygen (O) atoms. And then, nitrogen (N) atoms of elements constituting the first gas 101 may react with the oxygen (O) atoms which fill the vacancies formed due to silicon (Si) atoms escaping from the pattern portion 15a, thereby forming nitrogen monoxide (NO). That is, the pattern portion 15a may be substantially etched by forming the nitrogen monoxide (NO). And then, the nitrogen monoxide (NO) is combined with oxygen (O) included the second gas 103, thereby forming nitrogen dioxide ($NO_2$). Accordingly, as described above, the pattern portion 15a may be substantially etched by the chemical reaction.

In addition, nitrogen (N) atoms of elements constituting the first gas 101 may react with oxygen (O) atoms, thereby forming nitrogen dioxide ($NO_2$). The nitrogen dioxide ($NO_2$) may be volatilized into an air after donating an oxygen (O) atom to the pattern portion 15a. Accordingly, the nitrogen dioxide ($NO_2$) may serve to substantially passivate the pattern portion 15a.

That is, the first and second gases 101 and 103 absorbing energy from the laser beam L1 may generate the chemical reaction with the surface of the pattern portion 15a. The chemical reaction may include steps of etching and passivation of the pattern portion 15a at the same time. Roughness of the pattern portion 15a may be improved (e.g., reduced) through this process.

In addition, sidewalls of the pattern portion 15a may be formed perpendicular or close to perpendicular to a surface (e.g., upper surface) of the substrate 10.

Figure 11:
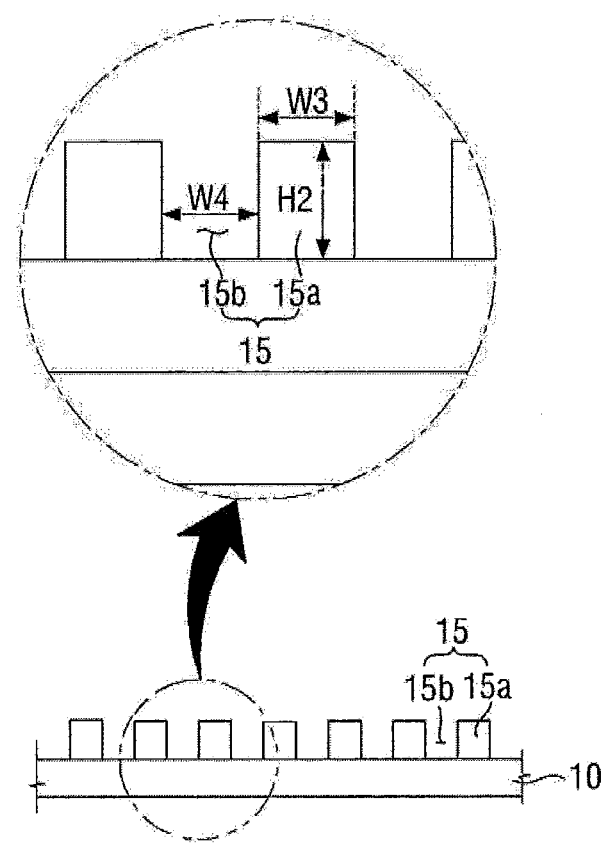

Referring to FIG. 11, the chemical reaction of the first and second gases 101 and 103 may be generated in the surface of the pattern portion 15a so that a size of the pattern portion 15a may be changed.

That is, the height of the pattern portion 15a may be changed from the first height H1 to a second height H2, and the width of the pattern portion 15a may be changed from the first width W1 to a third width W3. The second height H2 may be lower or smaller than the first height H1, and the third width W3 may be smaller than the first width W1. In addition the width of the recess portion 15b may be changed from the second width W2 to a fourth width W4 which may be larger than the second width W2.

The laser beam L1 may be irradiated towards the pattern portion 15a so that a difference between the first height H1 and the second height H2 may be greater than a difference between the first width W1 and the third width W3. Specifically, the difference between the first height H1 and the second height H2 may be at least 5 times greater than the difference between the first width W1 and the third width W3. However, the inventive concept is not limited thereto.

In the present example embodiments, the substrate 10 may be formed of a material that does not react with the first and second gases 101 and 103 and the laser beam L1. Accordingly, the substrate 10 may undergo no change during the changing of the pattern portion 15a.

In the present example embodiments, the width and height of the pattern portion 15a may be precisely controlled by reacting the first and second gases 101 and 103 with the pattern portion 15a using the laser. In addition, the profile and roughness of the pattern portion 15a may be also improved.

In addition, if the pattern portion 15a is a hard mask pattern for etching a semiconductor layer, it is possible to form fine semiconductor patterns.

Now, referring to FIGS. 12 to 15, a method of manufacturing a semiconductor device according to some example embodiments of the inventive concept will be described.

Figure 12:
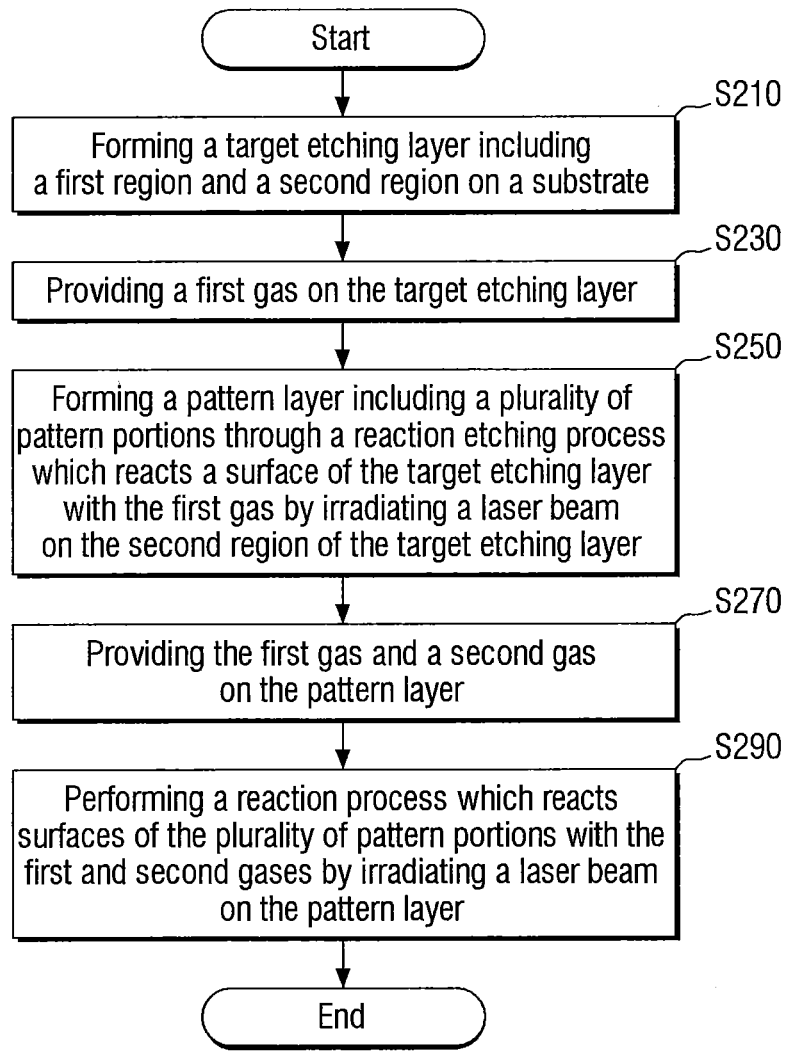
FIG. 12 is a flow chart illustrating a method of manufacturing a semiconductor device according to some example embodiments of the inventive concept.
Figure 13:
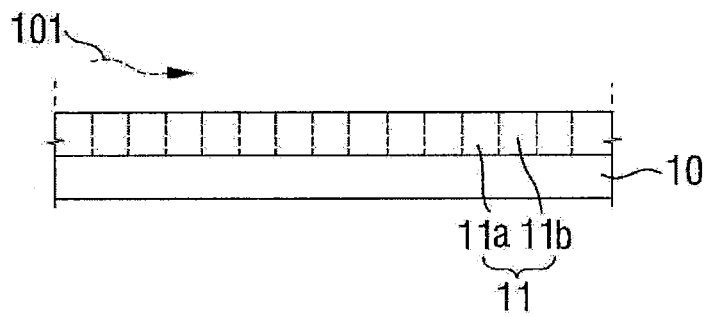
FIGS. 13 to 15 are cross-sectional views illustrating a method of manufacturing a semiconductor device according to some example embodiments of the inventive concept.
Figure 14:
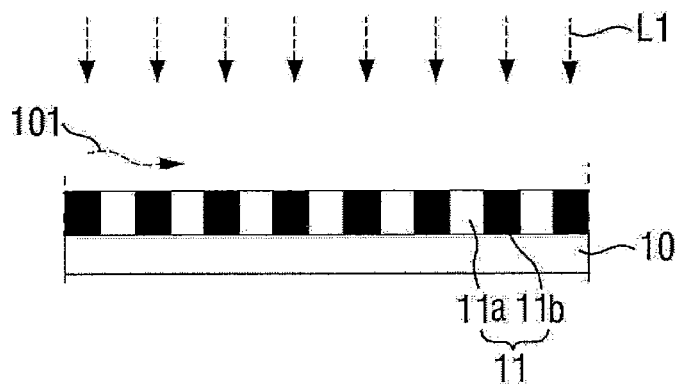
Figure 15:
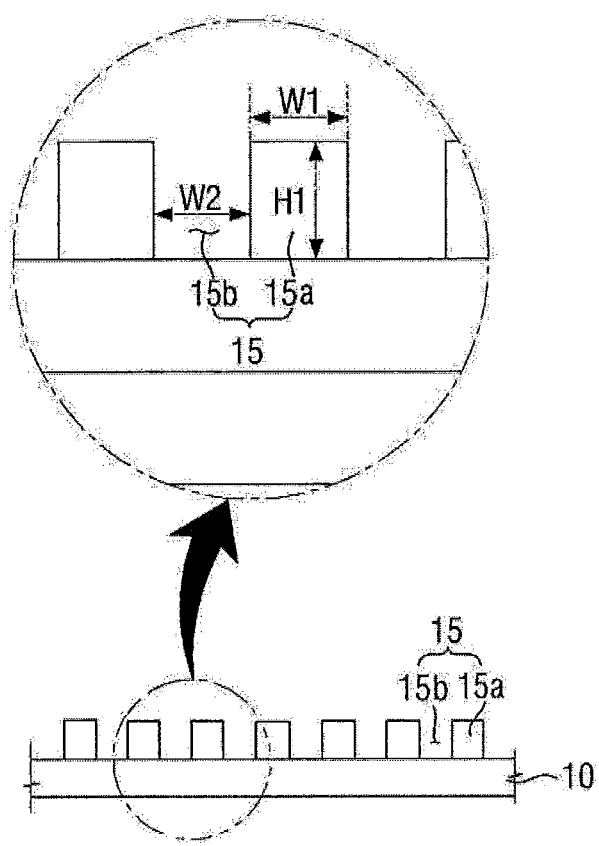

FIG. 12 is a flow chart illustrating a method of manufacturing a semiconductor device according to some example embodiments of the inventive concept. FIGS. 13 to 15 are cross-sectional views illustrating a method of manufacturing a semiconductor device according to some example embodiments of the inventive concept.

The method of manufacturing a semiconductor device according to this example embodiment is substantially identical to the method described above with reference to FIGS. 1 to 11, except for FIGS. 1 to 7. That is, a processing step shown in FIG. 15 is substantially identical to the processing step shown in FIG. 8, and a subsequent processing step may be identical to the example embodiment described above. Accordingly, like reference numerals and names denote like elements, and descriptions of the identical elements may be omitted to avoid redundancy.

Referring to FIG. 12, a method of manufacturing a semiconductor device according to example embodiments may include forming a target etching layer including a first region and a second region on a substrate (step S210), providing a first gas on the target etching layer (step S230), forming a pattern layer including a plurality of pattern portions through a reaction etching process which reacts a surface, of the target etching layer with the first gas by irradiating a laser beam on the second region of the target etching layer (step S250), providing the first gas and a second gas on the pattern layer (step S270), and performing a reaction process which reacts surfaces of the plurality of pattern portions with the first and second gases by irradiating a laser beam on the pattern layer (step S290).

A method of manufacturing a semiconductor device according to this example embodiment may include steps of forming the pattern layer using the laser instead of the lithography technique described in FIGS. 1 to 11.

Referring to FIGS. 12 and 13, a target etching layer 11 including a first region 11a and a second region 11b may be formed on a substrate 10 (step S210), and a first gas 101 may be provided on the target etching layer 11 (step S230). The first region 11a and the second region 11b may be distinguished according to whether a laser beam L1 is irradiated thereon or not.

In this example embodiment, since the processing step shown in FIG. 13 is a step forming a basic pattern, the first gas 101 may be only used. However, the inventive concept is not limited thereto. As described above, the second gas 103 may be used together with the first gas 101.

Referring to FIGS. 12, 14 and 15, a pattern layer 15 including a plurality of pattern portions 15a may be formed through a reaction etching process which reacts a surface of the target etching layer 11 with the first gas 101 by irradiating the laser beam L1 on the second region 11b of the target etching layer 11 (step S250). In other words, a reaction between the first gas 101 and a surface of the target etching layer 11 may occur due to the irradiation of the laser beam L1 on the second region 11b of the target etching layer 11. As shown in the drawings, the second region 11b may be completely removed to expose the substrate 10. However, the inventive concept is not limited thereto. In other words, a portion of the second region 11b may remain on the substrate 10, and the portion of the second region 11b may be removed through a subsequent step (step S290).

Subsequently, the first and second gases 101 and 103 may be provided on the pattern layer 15 (step S270), and a reaction process, which reacts surfaces of the plurality of pattern portions with the first and second gases by irradiating a laser beam on the pattern layer, may be performed (step S290). Step S270 is substantially identical to step S150 according to the example embodiment described previously, and step S290 is substantially identical to step S170 according to the example embodiment described previously. Therefore, descriptions of the identical steps and associated elements will not be made to avoid redundancy.

Now, referring to FIGS. 16 to 21, a method of manufacturing a semiconductor device according to some example embodiments of the inventive concept will be described.

Figure 16:
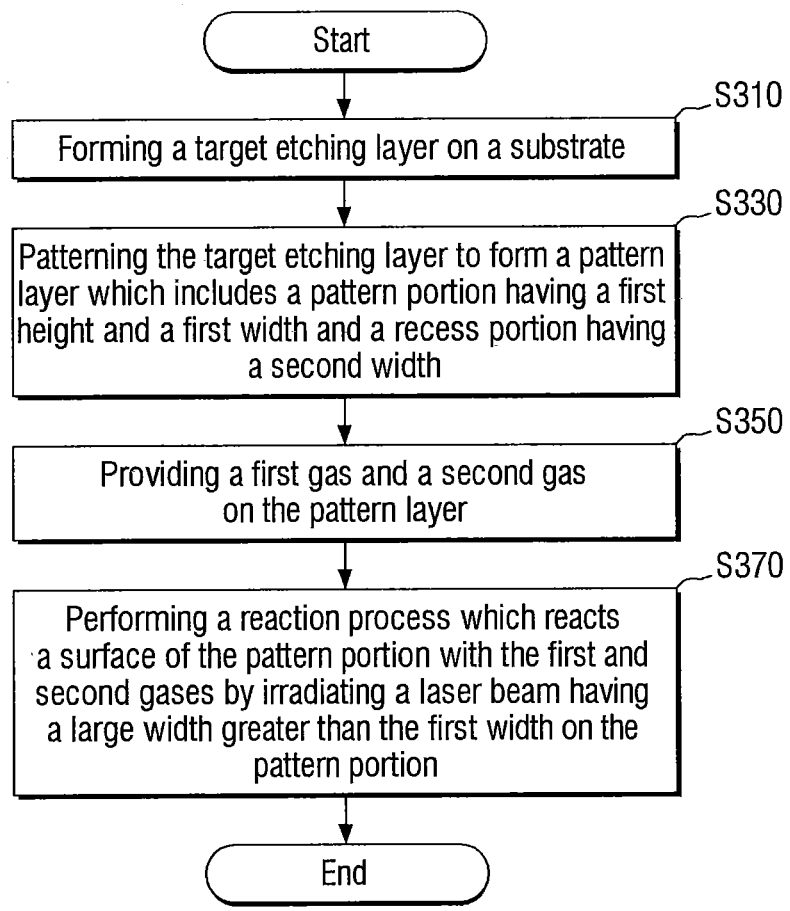
FIG. 16 is a flow chart illustrating a method of manufacturing a semiconductor device according to some example embodiments of the inventive concept.
Figure 17:
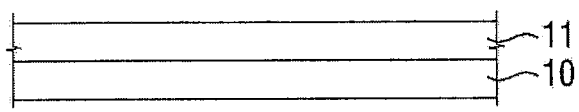
FIGS. 17 to 21 are cross-sectional views illustrating a method of manufacturing a semiconductor device according to some example embodiments of the inventive concept.
Figure 18:
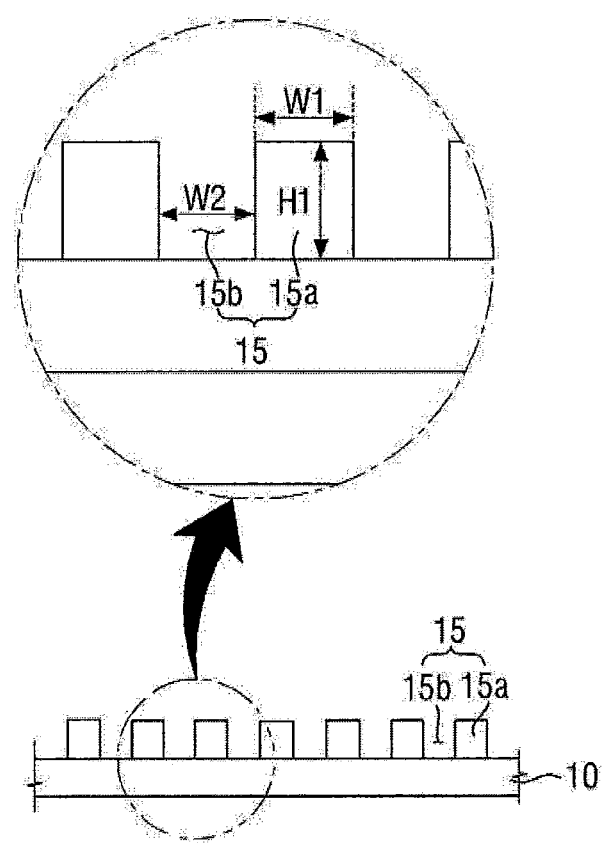
Figure 19:
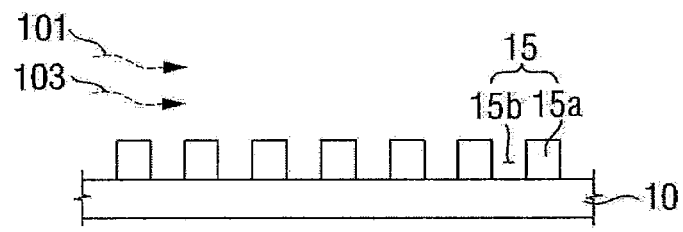

FIG. 16 is a flow chart illustrating a method of manufacturing a semiconductor device according to some example embodiments of the inventive concept. FIGS. 17 to 21 are cross-sectional views illustrating a method of manufacturing a semiconductor device according to some example embodiments of the inventive concept.

Figure 20:
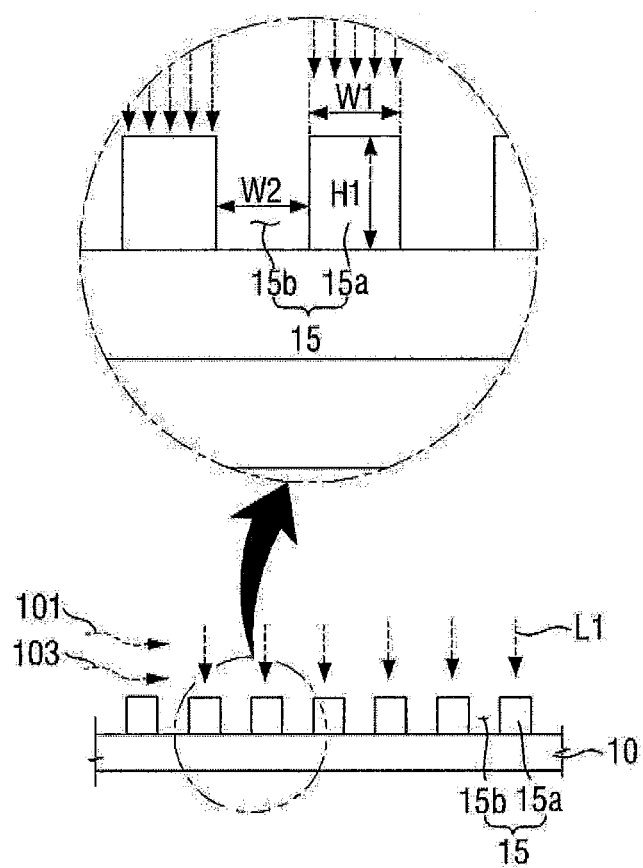

A method of manufacturing a semiconductor device according to this example embodiment is substantially identical to the method described above with reference to FIGS. 1 to 11, except for a processing step shown in FIG. 20. That is, the method of manufacturing a semiconductor device according to this example embodiment is substantially identical to the method described above with reference to FIGS. 1 to 11, except for irradiating a laser beam on the pattern portion. Accordingly, like reference numerals and names denote like elements, and descriptions of the identical elements may be omitted to avoid redundancy.

Referring to FIG. 16, a method of manufacturing a semiconductor device according to example embodiments may include forming a target etching layer on a substrate (step S310), patterning the target etching layer to form a pattern layer which includes a pattern portion having a first height and a first width and a recess portion having a second width (step S330), providing a first gas and a second gas on the pattern layer (step S350), and performing a reaction process which reacts a surface of pattern portion with the first and second gases by irradiating a laser beam having a width (e.g., a large width) greater than the first width on the pattern portion (step S370).

That is, the method of manufacturing a semiconductor device according to this example embodiment is substantially identical to the method described above with reference to FIGS. 1 to 11, except for irradiating a laser beam having a large width on the pattern portion.

Referring to FIGS. 16 and 17 to 19, a target etching layer 11 may be formed on a substrate 10 (step S310). A pattern layer 15, which includes a pattern portion 15a having a first height H1 and a first width W1 and a recess portion 15b having a second width W2, may be formed by patterning the target etching layer 11 (step S330). A first gas 101 and a second gas 103 may be provided on the pattern layer 15 (step S350).

Referring to FIGS. 16 and 20, a reaction process, which reacts a surface of pattern portion 15a with the first and second gases 101 and 103, may be performed by irradiating a laser beam L1 having a large width greater than the first width W1 on the pattern portion 15a (step S370). In other words, a reaction between the first and second gases 101 and 103 and a surface of the pattern portion 15a may occur due to the irradiation of the laser beam L1 having a width greater than the first width W1 on the pattern portion 15a.

In this example embodiment, the laser beam L1 may have a large width greater than the first width W1 of the pattern portion 15a. Accordingly, the laser beam L1 may be irradiated onto the entire or some of the plurality of pattern portions 15a. The recess region 15b may include a region where the laser beam L1 is not irradiated.

If the laser beam L1 is irradiated on some of the plurality of the pattern portions 15a, the laser beam L1 may have a large width which is greater by about 10% than the first width W1 of the pattern portion 15a so as to not irradiate the laser beam L1 on the adjacent pattern portion 15a.

Figure 21:
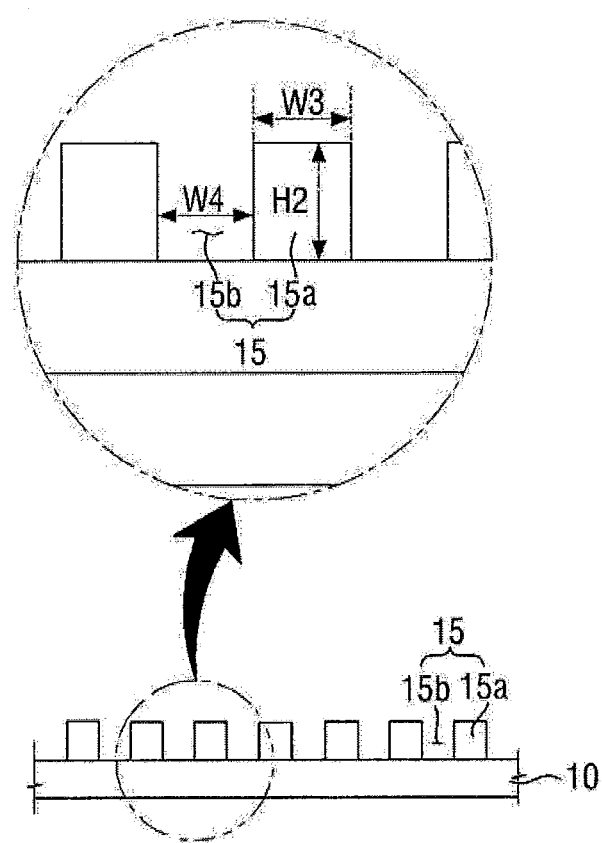

Referring to FIG. 21, if the laser beam L1 is irradiated on a specific pattern portion 15a, the width and height of the specific pattern portion 15a may be changed to the third width W3 and second height H2, respectively. Also, the width of the recess region 15b may be changed from the second width W2 to the fourth width W4.

In this example embodiment, since the laser beam is irradiated only on the specific pattern portion 15a, it is possible to form the pattern portion 15a having different height and/or width on the same substrate 10.

Now, referring to FIGS. 22 to 27, a method of manufacturing a semiconductor device according to some example embodiments of the inventive concept will be described.

Figure 22:
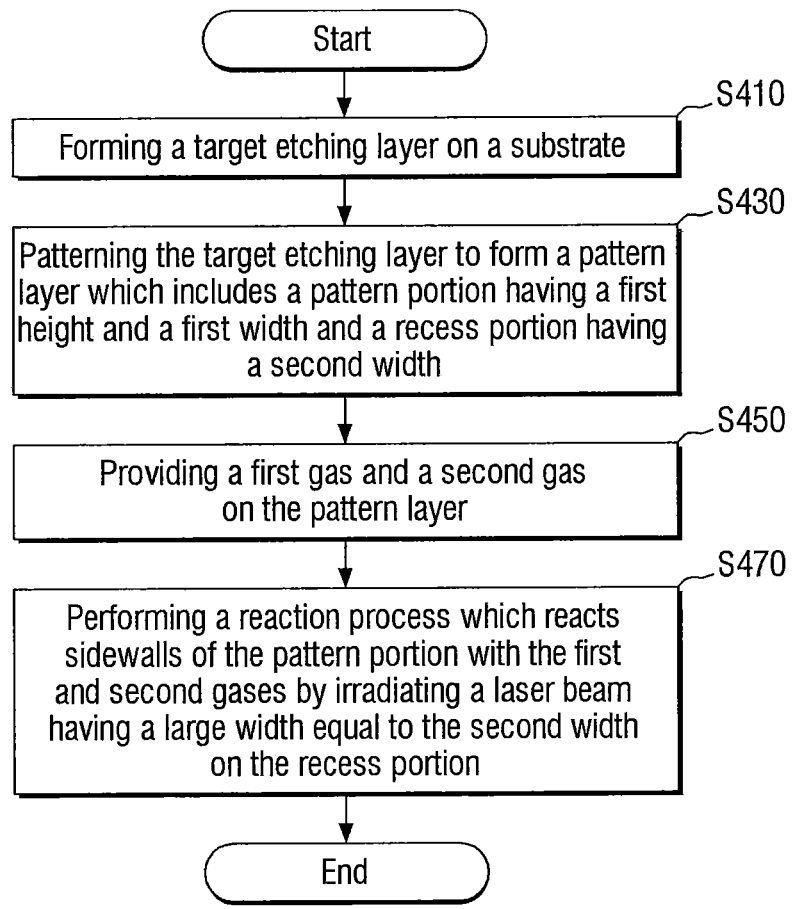
FIG. 22 is a flow chart illustrating a method of manufacturing a semiconductor device according to some example embodiments of the inventive concept.
Figure 23:
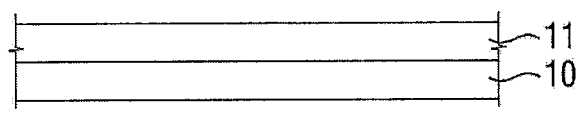
FIGS. 23 to 27 are cross-sectional views illustrating a method of manufacturing a semiconductor device according to some example embodiments of the inventive concept.
Figure 24:
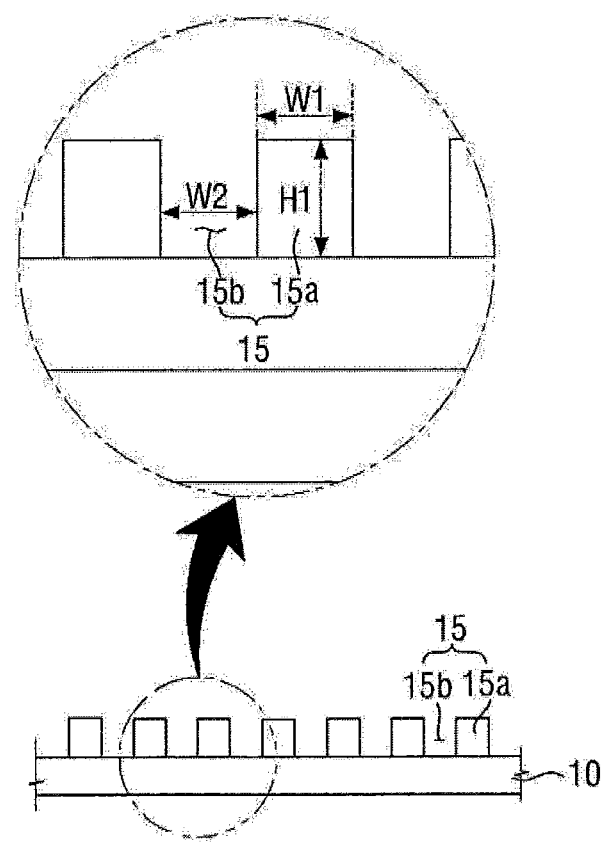
Figure 25:
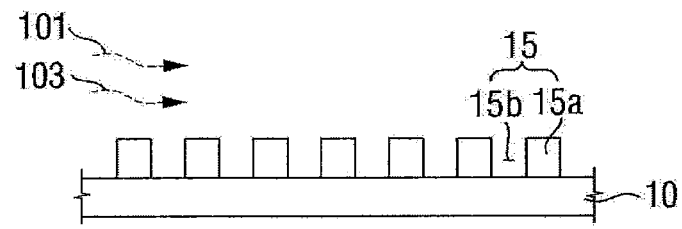

FIG. 22 is a flow chart illustrating a method of manufacturing a semiconductor device according to some example embodiments of the inventive concept. FIGS. 23 to 27 are cross-sectional views illustrating a method of manufacturing a semiconductor device according to some example embodiments of the inventive concept.

A method of manufacturing a semiconductor device according to this example embodiment is substantially identical to the method described above with reference to FIGS. 1 to 11, except for irradiating a laser beam on the recess portion. Accordingly, like reference numerals and names denote like elements, and descriptions of the identical elements may be omitted to avoid redundancy.

Referring to FIG. 22, a method of manufacturing a semiconductor device according to example embodiments may include forming a target etching layer on a substrate (step S410), patterning the target etching layer to form a pattern layer which includes a pattern portion having a first height and a first width and a recess portion having a second width (step S430), providing a first gas and a second gas on the pattern layer (step S450), and performing a reaction process which reacts sidewalls of pattern portion with the first and second gases by irradiating a laser beam having a large width equal to the second width on the recess portion (step S470).

That is, the method of manufacturing a semiconductor device according to this example embodiment is substantially identical to the method described above with reference to FIGS. 16 to 21, except for irradiating the laser beam L1 on the recess portion 15b instead of the pattern portion 15a.

Referring to FIGS. 22 to 25, a target etching layer 11 may be formed on a substrate 10 (step S410). A pattern layer 15, which includes a pattern portion 15a having a first height H1 and a first width W1 and a recess portion 15b having a second width W2, may be formed by patterning the target etching layer 11 (step S430). A first gas 101 and a second gas 103 may be provided on the pattern layer 15 (step S450).

Figure 26:
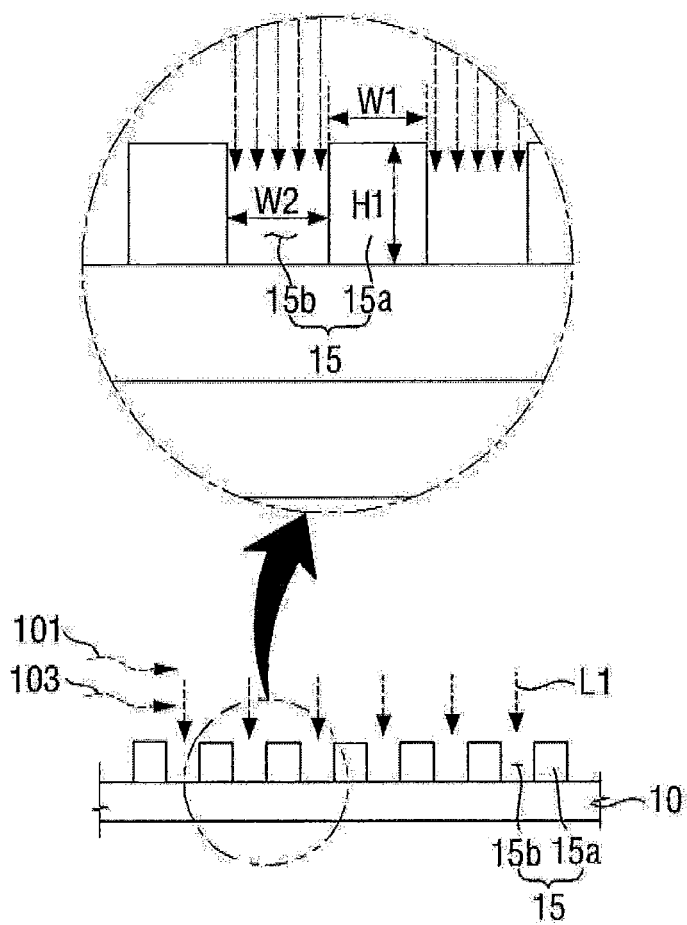

Subsequently, referring to FIGS. 22 and 26, a reaction process, which reacts with sidewalls of pattern portion 15a and the first and second gases 101 and 103, may be performed by irradiating a laser beam L1 having a large width equal to the second width W2 on the recess portion 15b (step S470). In other words, a reaction between the first and second gases 101 and 103 and sidewalls of the pattern portion 15a may occur due to the irradiation of the laser beam L1 having a width equal to the second width W2 on the recess portion 15b.

In this example embodiment, since the laser beam L1 having a large width equal to the second width W2 is irradiated on the recess portions 15b, the sidewalls of the pattern portion 15a may be effectively etched. That is, the sidewalls of the pattern portion 15a may be removed more quickly than an upper portion of the pattern portion 15a.

In this example embodiment, it is not necessary to irradiate the laser beam L1 having a large width completely or exactly equal to the second width W2 on the recess portion 15b. Accordingly, the laser beam L1 may have a large width which is greater by about 5% than the second width W2.

In addition, the second width W2 of the recess portion 15b may be gradually increased in accordance with a removal of portions of the sidewalls of the pattern portion 15a. In this case, the large width of the laser beam L1 may be also increased in accordance with an increase of the second width W2 of the recess portion 15b.

Figure 27:
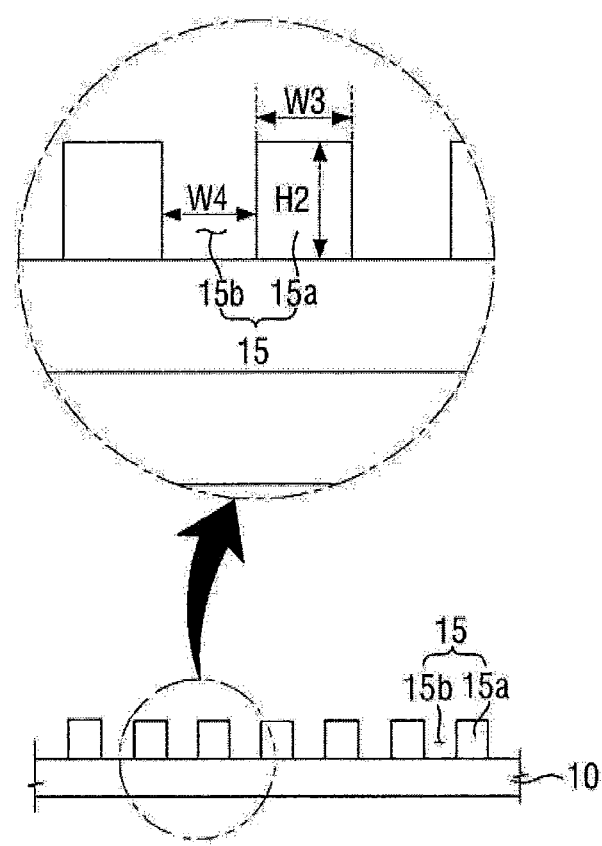

Referring to FIG. 27, the pattern portion 15a may have a third width W3 smaller than the first width W1, and a second height H2 equal to the height H1. This does not necessarily mean that the first and second heights H1 and H2 are completely or exactly identical. Also, the width of the recess region 15b may be changed from the second width W2 to the fourth width W4.

In this example embodiment, the laser beam L1 having a large width equal to the second width W2 is irradiated on the recess portion 15b so that the width of the pattern portion 15a may be varied as much as possible while minimizing the height variation of the pattern portion 15a.

Now, referring to FIGS. 28 to 34, a method of manufacturing a semiconductor device according to some example embodiments of the inventive concept will be described.

Figure 28:
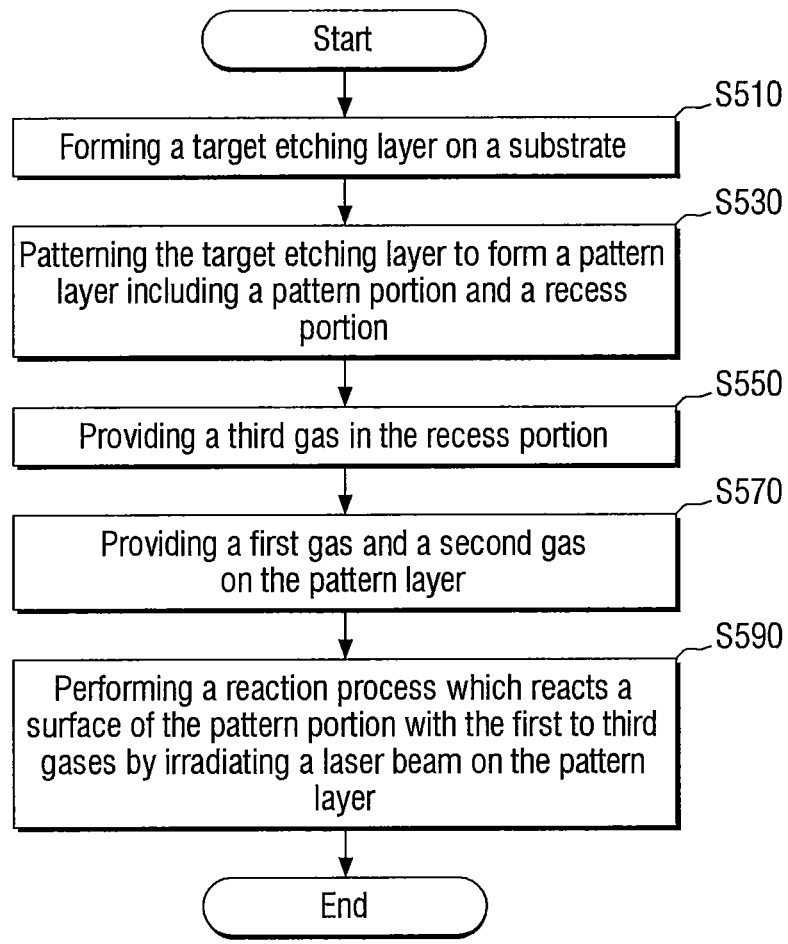
FIG. 28 is a flow chart illustrating a method of manufacturing a semiconductor device according to some example embodiments of the inventive concept.

FIG. 28 is a flow chart illustrating a method of manufacturing a semiconductor device according to some example embodiments of the inventive concept. FIGS. 29 to 34 are cross-sectional views illustrating a method of manufacturing a semiconductor device according to some example embodiments of the inventive concept.

A method of manufacturing a semiconductor device according to this example embodiment is substantially identical to the method described above with reference to FIGS. 1 to 11, except for providing a third gas in the recess portion. Accordingly, like reference numerals and names denote like elements, and descriptions of the identical elements may be omitted to avoid redundancy.

Referring to FIG. 28, a method of manufacturing a semiconductor device according to this example embodiments may include forming a target etching layer on a substrate (step S510), patterning the target etching layer to form a pattern layer including a pattern portion and a recess portion (step S530), providing a third gas in the recess portion (step S550), providing a first gas and a second gas on the pattern layer (step S570) and performing a reaction process which reacts a surface of the pattern portion with the first to third gases by irradiating a laser beam on the pattern layer (step S590).

Figure 29:
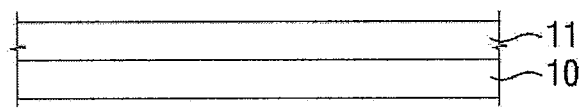
FIGS. 29 to 34 are cross-sectional views illustrating a method of manufacturing a semiconductor device according to some example embodiments of the inventive concept.
Figure 30:
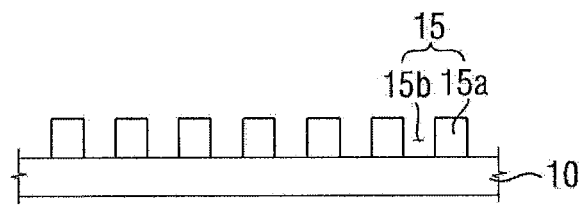

Referring to FIGS. 28 to 30, a target etching layer 11 may be formed on a substrate 10 (step S510). A pattern layer 15 including a pattern portion 15a and a recess portion 15b may be formed by patterning the target etching layer 11 (step S530).

Figure 31:
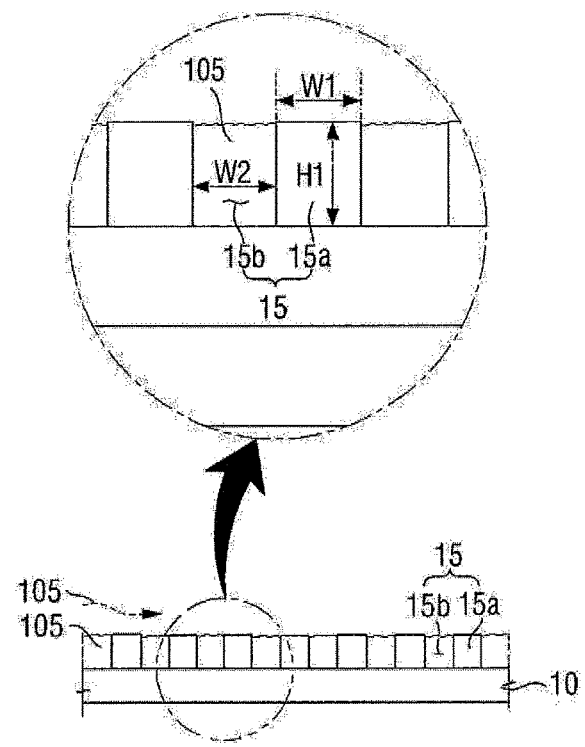
Figure 32:
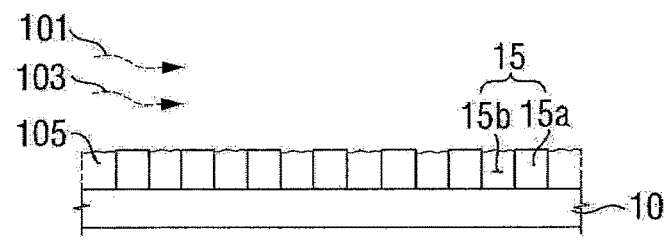

Subsequently, referring to FIGS. 28 and 31, a third gas 105 may be provided in the recess portion 15b (step S550).

The third gas 105 may contribute to etching of the pattern portion 15a. The third gas 105 may be the same gas as a gas which is formed by reacting with the first and second gases 101 and 103 in a subsequent process.

As described with reference to FIGS. 1 to 11, the chemical reaction process by the first and second gas 101 and 103 may include the etching process and passivation process with respect to the pattern portion 15a. In the etching process, the pattern portion 15a may be etched using NO gas, and in the passivation process, the pattern portion 15a may be passivated using $N_2O$ gas.

The third gas 105 may be a gas, for example, NO gas that contributes to the etching process.

In this example embodiment, the recess portion 15b may be filled with the third gas 105 which is injected into a chamber. More specifically, if the third gas 105 is injected into the chamber holding a state close to vacuum using a gas nozzle disposed adjacent to the pattern layer 15, the recess portion 15b may be filled with the third gas 105 due to gravity acting on the third gas. In a subsequent process, a first gas 101 and a second gas 103 may be provided on the pattern layer 15, and then, a laser beam L1 may be irradiated on the pattern layer 15. Since the recess portion 15b is already filled with NO gas that contributes to the etching process, the etching process may be more dominant in the recess portion 15b. Accordingly, the sidewalls of the pattern portion 15a may be effectively etched.

Figure 33:
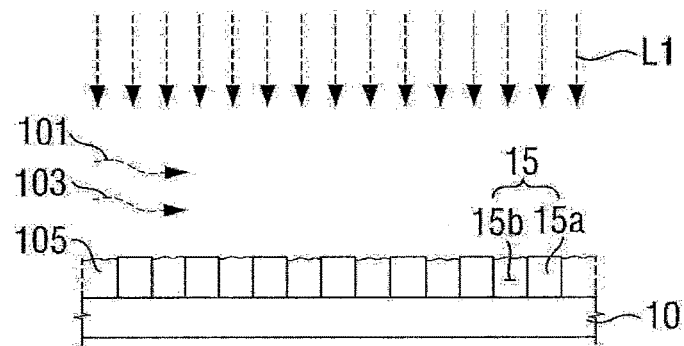
Figure 34:
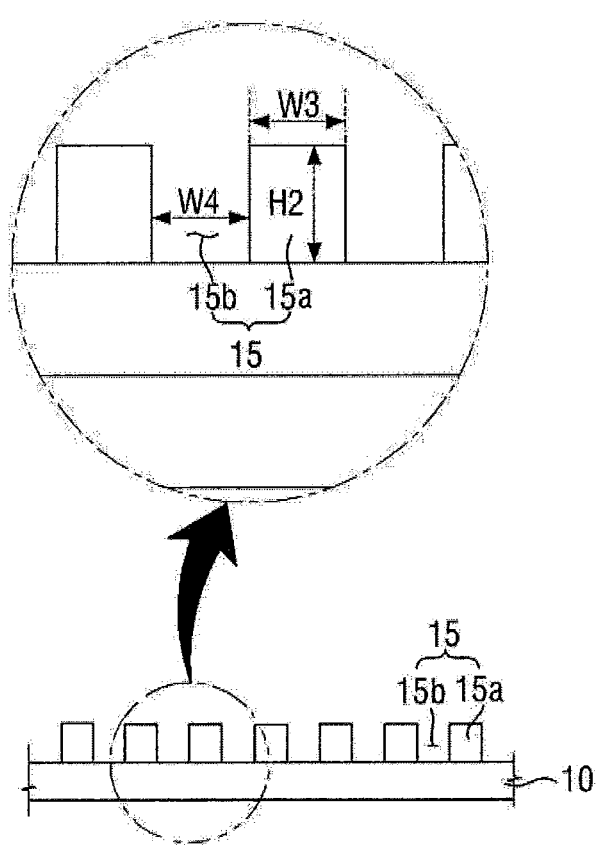

Referring to FIGS. 28, 33 and 34, a first gas 101 and a second gas 103 may be provided on the pattern layer 15 (step S570). A reaction process, which reacts a surface of pattern portion 15a with the first to third gases 101, 103 and 105, may be performed by irradiating a laser beam (step S590). In other words, a reaction between the first to third gases 101, 103 and 105 and a surface of the pattern portion 15a may occur due to the irradiation of the laser beam L1 on the pattern layer 15.

As described above, since the recess portion 15b is already filled with NO gas before providing the first and second gases 101 and 103, the pattern portion 15a may have a smaller third width W3 and higher or larger second height H2 than other embodiments.

Now, referring to FIG. 35, a method of manufacturing a semiconductor device according to some example embodiments of the inventive concept will be described.

Figure 35:
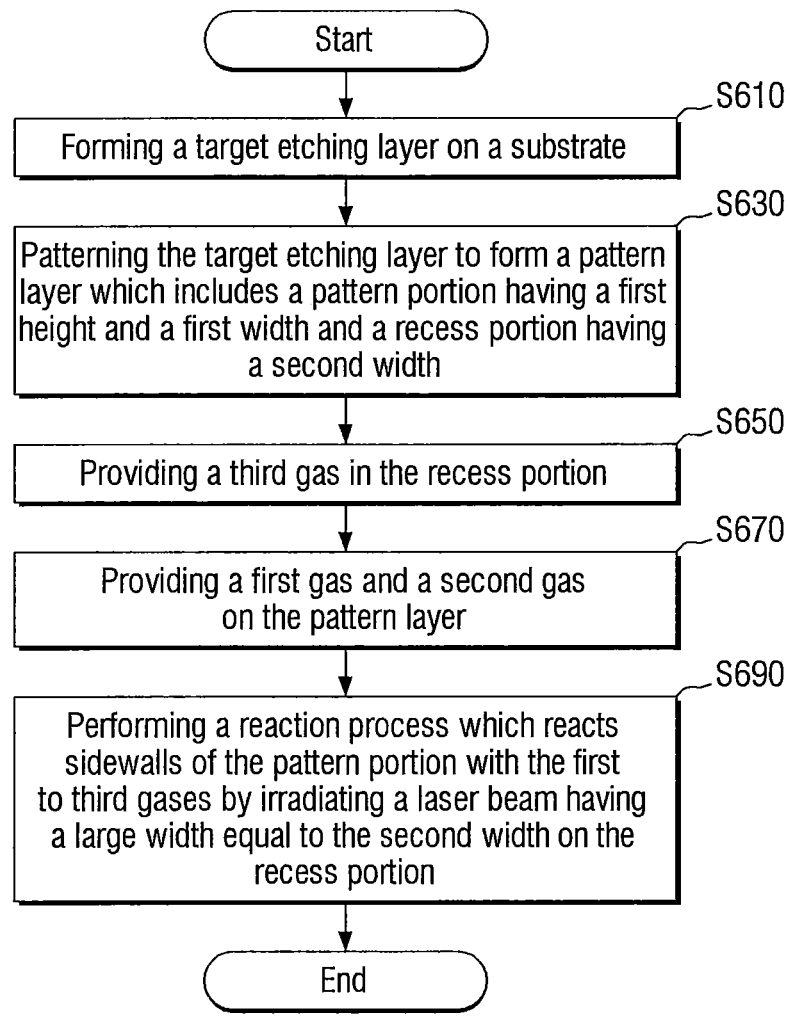
FIG. 35 is a flow chart illustrating a method of manufacturing a semiconductor device according to some example embodiments of the inventive concept.

FIG. 35 is a flow chart illustrating a method of manufacturing a semiconductor device according to some example embodiments of the inventive concept.

A method of manufacturing a semiconductor device according to this example embodiment is substantially identical to the method described above with reference to FIGS. 1 to 11, except for providing a third gas in a recess portion, and irradiating a laser beam having a width (e.g., a large width) equal to a second width on the recess portion. Accordingly, like reference numerals and names denote like elements, and descriptions of the identical elements may be omitted to avoid redundancy.

Referring to FIG. 35, a method of manufacturing a semiconductor device according to example embodiments may include forming a target etching layer (step S610), forming a pattern layer which includes a pattern portion having a first height and a first width and a recess portion having a second width by patterning the target etching layer (step S630), providing a third gas in the recess portion (step S650), providing a first gas and a second gas on the pattern layer (step S670) and performing a reaction process which reacts sidewalls of pattern portion with the first to third gases by irradiating a laser beam having a large width equal to a second width on the recess portion (step S690).

Figure 36:
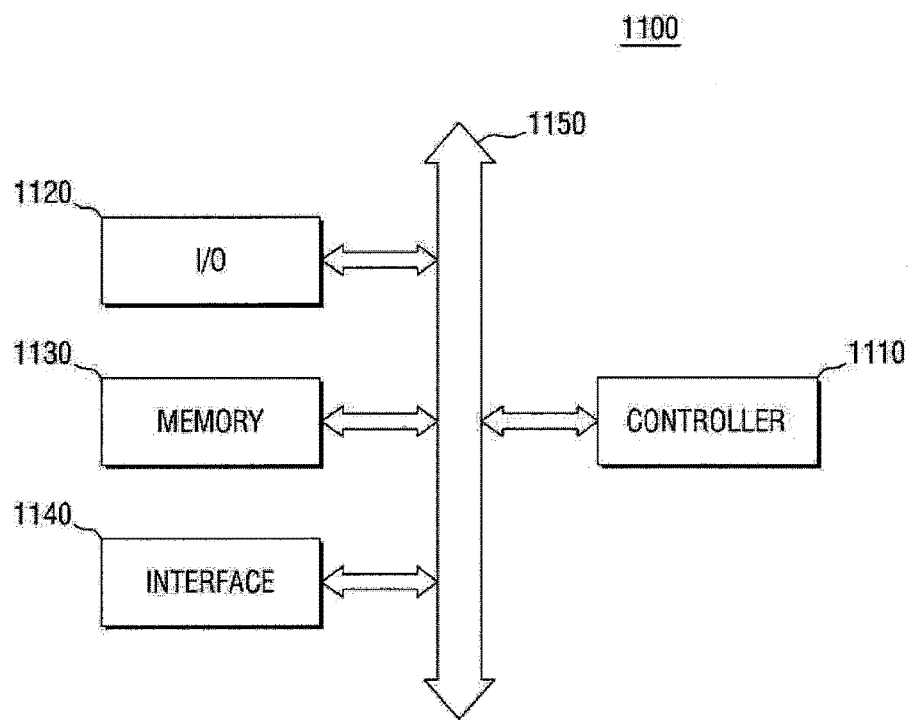
FIG. 36 is a block diagram of an electronic system including a semiconductor device manufactured by a manufacturing method according to some example embodiments of the inventive concept.

FIG. 36 is a block diagram of an electronic system including a semiconductor device manufactured by a manufacturing method according to some example embodiments of the inventive concept.

Referring to FIG. 36, the electronic system 1100 according to an example embodiment of the inventive concept may include a controller 1110, an I/O (input/output) device 1120, a memory device 1130, an interface 1140 and a bus 1150. The controller 1110, the I/O device 1120, the memory device 1130 and/or the interface 1140 may be connected to one another via the bus 1150. The bus 1150 may serve as a path via which data is transferred.

The controller 1110 may include at least one of a microprocessor, a digital signal processor, a microcontroller and logic elements capable of performing similar functions. The I/O device 1120 may include a keypad, a keyboard, a display device, etc. The memory device 1130 may store therein data and/or instructions, for example. The interface 1140 may be capable of transmitting/receiving data to/from a communication network. The interface 1140 may be either a wired or wireless interface. For example, the interface 1140 may include an antenna, a wired/wireless transceiver or the like. The electronic system 1100 may be an operational memory for improving the operation of the controller 1110 and may further include a high-speed DRAM and/or SRAM, for example. The semiconductor devices 1 to 11 according to some example embodiments of the inventive concept may be provided in the memory device 1130 or may be provided as a part of the controller 1110 or the I/O device 1120, for example.

The electronic system 11000 may be applied to a PDA (personal digital assistant), a portable computer, a web tablet, a wireless phone, a smart phone, a mobile phone, a digital music player, a memory card, or any electronic device capable of transmitting/receiving information in wireless environment.

Figure 37:
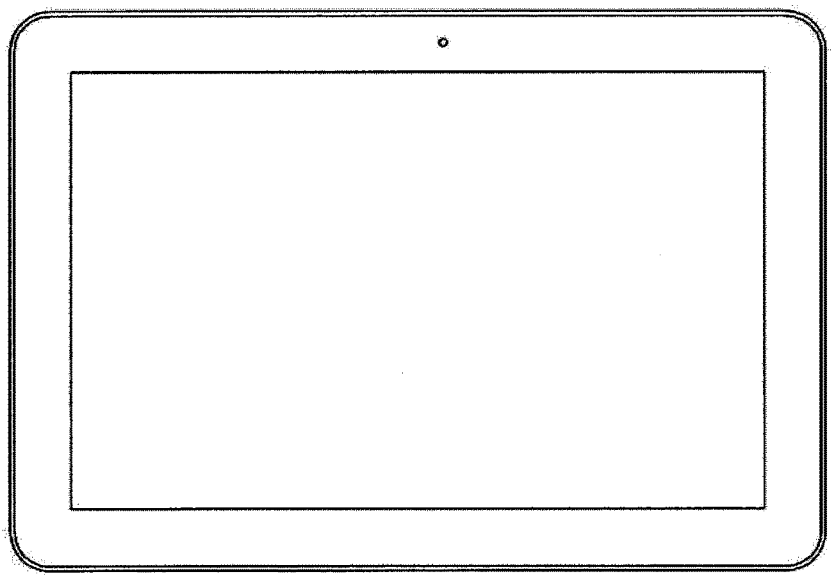
FIG. 37 shows an example of a semiconductor system that can employ the semiconductor devices fabricated according to some example embodiments of the inventive concept.

FIG. 37 shows an example of a semiconductor system that can employ the semiconductor devices fabricated according to some example embodiments of the inventive concept. FIG. 37 shows a tablet PC. The semiconductor devices fabricated according to some example embodiments of the inventive concept may be used for a table PC, a laptop computer, etc. As will be appreciated by those skilled in the art, the semiconductor devices fabricated according to some example embodiments of the inventive concept may be employed by other integrated circuit devices in addition to those mentioned above.

Although the example embodiments of the inventive concept have been described with reference to the accompanying drawings, those skilled in the art will readily appreciated that various modifications and alterations may be made without departing from the technical idea or essential features of the inventive concept. Therefore, it should be understood that the above-mentioned embodiments are not limiting but illustrative in all aspects.

What is claimed is:

1. A method of manufacturing a semiconductor device, the method comprising:
   forming a target etching layer directly on a glass substrate;
   patterning the target etching layer to form a pattern layer including a pattern portion having a first height and a first width and a recess portion having a second width;
   providing a first gas and a second gas on the pattern layer; and
   performing a reaction process including reacting the first and second gases with a surface of the pattern portion by irradiating a laser beam on the pattern layer,
   wherein the performing the reaction process comprises:
   removing a portion of sidewalls of the pattern portion so that the pattern portion has a third width that is smaller than the first width.

2. The method of claim 1, wherein the irradiating the laser beam on the pattern layer comprises:
   irradiating the laser beam having a width greater than the first width on the pattern portion.

3. The method of claim 1, wherein the irradiating the laser beam on the pattern layer comprises:
   irradiating the laser beam having a width equal to the second width on the recess portion.

4. The method of claim 3, wherein the performing the reaction process comprises:
   reacting the first and second gases with the sidewalls of the pattern portion.

5. The method of claim 1, further comprising:
   providing a third gas in the recess portion before providing the first gas and the second gas, wherein the third gas contributes to removing a portion of the pattern portion.

6. The method of claim 1, wherein the substrate does not react with the first and second gases during the irradiating the laser beam on the pattern layer.

7. The method of claim 1, wherein the first gas is a halogen compound gas, and the second gas is an oxygen gas.

8. The method of claim 1, wherein the performing the reaction process comprises:
removing a portion of an upper portion of the pattern portion such that the pattern portion has a second height that is smaller than the first height.

9. The method of claim 8, wherein a difference between the first height and the second height is at least 5 times greater than a difference between the first width and the third width.

10. The method of claim 1, wherein the pattern layer includes a plurality of pattern portions each having the first height and the first width and a plurality of recess portions each having the second width,
the performing the reaction process comprises reacting the first and second gases with a surface of each pattern portion by irradiating a laser beam on the pattern layer, and
the performing the reaction process comprises removing a portion of sidewalls of each pattern portion so that each pattern portion has the third width that is smaller than the first width.

11. A method of manufacturing a semiconductor device, the method comprising:
forming a target etching layer on a substrate;
patterning the target etching layer to form a pattern layer including a plurality of pattern portions each having a first height and a first width and a plurality of recess portions each having a second width;
providing a third gas in each recess portion; then
providing a first as and a second gas on the pattern layer; and
performing a reaction process including reacting the first, second, and third gases with a surface of each pattern portion by irradiating a laser beam on the pattern layer,
wherein the performing the reaction process comprises:
removing a portion of sidewalls of each pattern portion so that each pattern portion has a third width that is smaller than the first width,
wherein the first gas is a halogen compound gas, the second gas is an oxygen gas, and the third gas is NO gas.

12. The method of claim 11, wherein the third gas contributes to removing a portion of each pattern portion, and the same gas as the third gas is formed by the reaction process including reacting the first and second gases with the surface of each pattern portion.

13. The method of claim 11, wherein the irradiating the laser beam on the pattern layer comprises:
irradiating the laser beam having a width greater than the first width on each pattern portion.

14. The method of claim 11, wherein the irradiating the laser beam on the pattern layer comprises:
irradiating the laser beam having a width equal to the second width on each recess portion, and
wherein the performing the reaction process comprises:
reacting the first, second, and third gases with sidewalls of each pattern portion.

15. The method of claim 11, wherein the substrate does not react with the first, second, and third gases during the irradiating the laser beam on the pattern layer.

16. The method of claim 11, wherein the performing the reaction process comprises:
removing a portion of an upper portion of each pattern portion such that each pattern portion has a second height that is smaller than the first height, and
wherein a difference between the first height and the second height is at least 5 times greater than a difference between the first width and the third width.

17. A method of manufacturing a semiconductor device, the method comprising:
forming a photo mask layer directly on a light transmissive substrate;
patterning the photo mask layer to form a photo mask pattern layer including a plurality of pattern portions each having a first height and a first width and a plurality of recess portions each having a second width;
providing a first gas and a second gas on the photo mask pattern layer; and
generating a chemical reaction between the first and second gases and a surface of each pattern portion by irradiating a laser beam on the photo mask pattern layer to remove a portion of sidewalls of each pattern portion so that each pattern portion has a third width that is smaller than the first width.

18. The method of claim 17, wherein the first gas is a halogen compound gas, and the second gas is an oxygen gas.

19. The method of claim 3, further comprising increasing the width of the laser beam in accordance with an increase of the second width of the recess portion.

20. The method of claim 18, further comprising:
providing a third gas on the photo mask pattern layer before providing the first gas and the second gas, wherein the third gas contributes to remove a portion of the sidewalls of each pattern portion,
wherein the third gas is NO gas.

* * * * *